United States Patent
Achter et al.

(10) Patent No.: US 10,097,086 B2
(45) Date of Patent: Oct. 9, 2018

(54) FAST RAMP LOW SUPPLY CHARGE PUMP CIRCUITS

(71) Applicant: Cypress Semiconductor Corporation, San Jose, CA (US)

(72) Inventors: Michael Achter, Mountain View, CA (US); Evrim Binboga, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/717,457

(22) Filed: Sep. 27, 2017

(65) Prior Publication Data
US 2018/0102704 A1   Apr. 12, 2018

Related U.S. Application Data

(60) Provisional application No. 62/407,172, filed on Oct. 12, 2016.

(51) Int. Cl.
| | |
|---|---|
| *H02M 3/07* | (2006.01) |
| *G11C 5/14* | (2006.01) |
| *G11C 16/30* | (2006.01) |
| *G11C 16/14* | (2006.01) |
| *G11C 16/26* | (2006.01) |

(52) U.S. Cl.
CPC ............... *H02M 3/07* (2013.01); *G11C 5/145* (2013.01); *G11C 16/30* (2013.01); *G11C 16/14* (2013.01); *G11C 16/26* (2013.01)

(58) Field of Classification Search
CPC .......... H02M 3/07; G11C 5/145; G11C 16/30; G11C 16/26; G11C 16/14
See application file for complete search history.

(56) References Cited

U.S. PATENT DOCUMENTS

| | | | |
|---|---|---|---|
| 5,767,735 | A | 6/1998 | Javanifard et al. |
| 5,781,473 | A | 7/1998 | Javanifard et al. |
| 5,945,870 | A | 8/1999 | Chu et al. |
| 6,275,096 | B1 | 8/2001 | Hsu et al. |
| 6,373,333 | B2 | 4/2002 | Egnot |
| 6,736,474 | B1 | 5/2004 | Tiede |
| 7,965,130 | B1 | 6/2011 | Cook et al. |
| 8,462,578 | B2 | 6/2013 | Neto et al. |
| 8,547,168 | B2 | 10/2013 | Kok et al. |

(Continued)

FOREIGN PATENT DOCUMENTS

WO    2009155540 A1    12/2009

OTHER PUBLICATIONS

Kumar, Vikash, "Design of CNFET Based Charge Pump for RF Energy Harvesting Applications," IEEE Journal, 2015, pp. 1-3; 3 pages.

(Continued)

*Primary Examiner* — Ajay Ojha (57) ABSTRACT

Techniques for fast ramp, low supply charge-pump circuits are described herein. In an example embodiment, a non-volatile memory device comprises a flash memory array coupled to a fast charge-pump circuit. The charge-pump circuit comprises a first charge pump, an active charge pump coupled as input to the first charge pump, and a power supply coupled as input to the active charge pump. The active charge pump is configured to initialize the first charge pump to a greater absolute voltage than the power supply and to provide power to the first charge pump during an active mode of the flash memory array.

18 Claims, 6 Drawing Sheets

(56) References Cited

U.S. PATENT DOCUMENTS

| | | |
|---|---|---|
| 9,438,104 B2 | 9/2016 | Ma |
| 9,515,548 B2 | 12/2016 | Good et al. |
| 9,653,126 B2 | 5/2017 | Nguyen et al. |
| 2005/0057963 A1 | 3/2005 | Ogura et al. |
| 2009/0261892 A1 | 10/2009 | Joo |
| 2011/0133820 A1 | 6/2011 | Pan |

OTHER PUBLICATIONS

International Search Report for International Application No. PCT/US2017/053935 dated Dec. 1, 2017; 2 pages.
Written Opinion of the International Searching Authority for International Application PCT/US2017/053935 dated Dec. 1, 2017; 4 pages.

FAST RAMP LOW SUPPLY CHARGE PUMP CIRCUITS

PRIORITY

This application claims priority to U.S. Provisional Application No. 62/407,172, filed on Oct. 12, 2016, the entire content of which is incorporated by reference herein.

TECHNICAL FIELD

This disclosure generally relates to memory devices and, in particular, to charge pumps used therein.

BACKGROUND

Memory devices, such as non-volatile memories, are widely used for storing data in computing devices. To perform memory operations (e.g., such as read, write, program, and erase operations), memory devices use various power supplies to provide power to various circuits such as voltage generators and regulators. In various applications, circuits with conventional power supplies may suffer from various deficiencies, one of which is slow ramp time. In order to achieve a faster circuit ramp time, some memory devices may use replenished power supplies that are configured to maintain a rather high voltage (e.g., 5V up to 10V) even while in standby when no memory operations are being performed. However, maintaining a high standby voltage comes at the expense of a high standby current leakage, which leads to inefficient power use that may be a significant drawback in some battery-powered applications (e.g., such as mobile phones, tablets, etc). In addition, in order to maintain higher standby voltages, a semiconductor chip typically needs larger than normal capacitors, transistors, and other such electronic components, which leads to a less efficient chip layout.

DETAILED DESCRIPTION

The following description sets forth numerous specific details such as examples of specific systems, components, methods, and so forth, in order to provide a good understanding of various embodiments of the techniques described herein for fast ramp, low supply charge-pump circuits. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description and in which similar reference numbers may refer to similar components or operations. The drawings show illustrations in accordance with exemplary embodiments. These embodiments, which may also be referred to herein as "examples", are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the described subject matter but rather to enable one skilled in the art to practice, make, and/or use such subject matter.

The techniques described herein provide for fast ramp, low supply charge-pump circuits that can be used in memory devices to provide power to voltage generators, regulators, and other electronic components for memory operations, but without the deficiencies of replenished power supplies such as high standby voltage, high standby current leakage, and larger chip area. As used herein, "replenish" (and its word derivatives) refers to an operation in which the voltage of a leaky electronic node is returned to a known/fixed starting value. The techniques described herein provide for a charge-pump circuit with an active charge pump. As used herein, "active charge pump" refers to a charge pump that maintains an output voltage when other charge pump(s) in the charge-pump circuit are idle or off. An active charge pump operates in both standby and active modes at a lower power supply voltage (e.g., lower than 5V) with lower standby leakage current and replenished initialization, and is configured to provide initialization (init) voltages and supply voltages to other charge pumps in the circuit. In accordance with the techniques described herein, the active charge pump operates as a low supply charge pump with a fast ramp rate, but with low standby current leakage and better chip area than conventional replenished power supplies.

In an example embodiment, a fast charge-pump circuit comprises multiple charge pumps, an active charge pump coupled as input to a first charge pump of the multiple charge pumps, and a power supply coupled as input to the active charge pump. The active charge pump is configured to initialize the first charge pump to a greater absolute voltage than the power supply and to provide power (e.g., input voltage and current) during operation of the first charge pump. In one aspect, the multiple charge pumps include one or more charge pumps coupled to the active charge pump in parallel with the first charge pump. In another aspect, the multiple charge pumps include one or more charge pumps coupled in series to the output of the first charge pump. In an example aspect, the first charge pump is another active charge pump of the charge-pump circuit, where the multiple charge pumps include one or more charge pumps that may be coupled in parallel or in series to the output of the other active charge pump.

In another example embodiment, a non-volatile memory (NVM) device comprises a memory array and a fast charge-pump circuit, where the memory array and the charge-pump circuit may be disposed on the same semiconductor substrate. The charge-pump circuit comprises a first charge pump, an active charge pump coupled as input to the first charge pump, and a power supply coupled as input to the active charge pump. The active charge pump is configured to initialize the first charge pump to a greater absolute voltage than the power supply and to provide power (e.g., input voltage and current) to the first charge pump during an active mode of the memory array. In an example aspect of this embodiment, the power supply is configured to apply a voltage of approximately 1.8V to the active charge pump, and the active charge pump is configured to apply a voltage of approximately 3V to the first charge pump. In one aspect, the charge-pump circuit comprises a second charge pump that is coupled to the active charge pump in parallel with the first charge pump. In another aspect, the charge-pump circuit comprises a second charge pump that is coupled in series to the output of the first charge pump. In an example aspect, the first charge pump is another active charge pump of the charge-pump circuit, where the charge-pump circuit includes one or more charge pumps that may be coupled in parallel or in series to the output of the other active charge pump. In some example aspects, the first charge pump is configured to operate in the active mode during one or more memory operations on the memory array such as read, write, program, and/or erase operations. In one aspect, the memory device is a volatile memory device. In another aspect, the memory array is a flash memory array.

In another example embodiment, a method of operating a fast charge-pump circuit comprises: applying a power supply voltage to an active charge pump of the charge-pump circuit, where the active charge pump is coupled as input to multiple charge pumps of the charge-pump circuit; initializing, by the active charge pump, a first charge pump of the multiple charge pumps to a first voltage that has a greater absolute value than the power supply voltage; and providing power (e.g., input voltage and current) by the active charge pump to the first charge pump during operation of the first charge pump. In an example aspect of this embodiment, the power supply voltage is approximately 1.8V and the first voltage is approximately 3V. In one aspect, the method comprises initializing by the active charge pump a second charge pump, of the multiple charge pumps, to the first voltage. In another aspect, the first charge pump is coupled as input to a second charge pump of the multiple charge pumps, and the method further comprises applying by the first charge pump to the second charge pump a second voltage that is greater than the first voltage. In an example aspect, the first charge pump is another active charge pump of the charge-pump circuit. In various aspects of this embodiment, the active charge pump and the other charge pumps of the charge-pump circuit are operated under the control of hardware circuitry and/or firmware.

Figure 1:
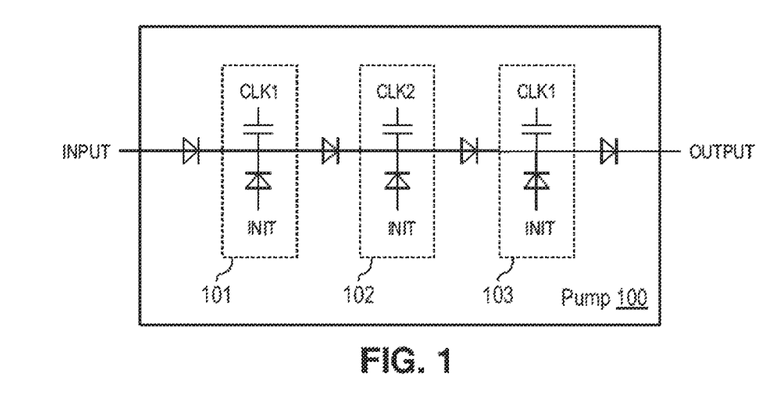
FIG. 1 is a block diagram illustrating an exemplary charge pump.

FIG. 1 is a block diagram illustrating a basic charge pump 100 for fast charge-pump circuits in accordance with the techniques described herein. For illustration purposes only, charge pump 100 is depicted in FIG. 1 with three stages, but it is understood that the pump may include fewer or more than three stages (e.g., depending on the desired voltage output).

Charge pump 100 includes multiple stages (e.g., stages 101, 102, and 103) with diodes coupled between each stage, where each stage has a boosting capacitor and a diode coupled as a node. Each stage has a boosting phase and a charging phase when charge pump 100 is in operation, and an initialization phase (e.g., idle phase) when charge pump 100 is being idle or off. At the start, each stage initializes to a power supply voltage level that is applied at an initialization (INIT) terminal of pump 100, and each stage then operates under the control of a signal applied at the clock (CLK) terminal to boost the voltage applied to the input (INPUT) terminal of the pump. Each stage of charge pump 100 is coupled to operate in an opposite clock phase to its preceding stage.

For example, during the first half of a clock cycle, the "odd numbered" pump stages 101 and 103 are in the boosting phase, and the "even numbered" pump stage 102 is in the charging phase. During the second half of the clock cycle, the "odd numbered" pump stages 101 and 103 are in the charging phase, and the "even numbered" pump stage 102 is in the boosting phase. At the start of a clock cycle stage 101 is initialized to 3V, as is stage 102. During its boosting phase, stage 101 gets boosted up by its capacitor and the clock signal to 4V and shares its charge with stage 102 (during the charging phase of stage 102), bringing stage 102 up to 3.5V. When stage 102 moves to its boosting phase at the second half of the clock cycle, it gets boosted by its capacitor from 3.5V up to 4.5V, and shares its charge with stage 103 (during the charging phase of stage 103), thereby bringing up stage 103 up to 3.75V. During the boosting phase of stage 102, the capacitor of stage 101 has coupled back down (e.g., below 3V) by the falling clock signal and pre-charges again to 3V. With each successive clock cycle, this boost/charge will continue to increase the voltage at each successive stage of charge pump 100 until each stage has reached its steady state voltages. In this manner, after a number of clock cycles, the boosted voltage gets propagated through charge pump 100 to its output.

In a fast charge-pump circuit with multiple charge pumps according to the techniques described herein, the initialization terminal of one or more of the multiple charge pumps (e.g., such as pump 100) is connected not to a custom power supply, but instead to a higher voltage internally generated from an active charge pump. The first stage of the active charge pump gets its input and initialization voltages from a power supply. The input terminal of the first pump, in the multiple charge pumps, is connected to the output of the active charge pump, and the input terminal of each succeeding pump is connected to the output of the preceding pump or directly to the output of the active charge pump. In this manner, the techniques described herein ensure a fast ramp time for the entire charge-pump circuit, but at a lower power supply voltage with lower standby leakage current.

Figure 2A:
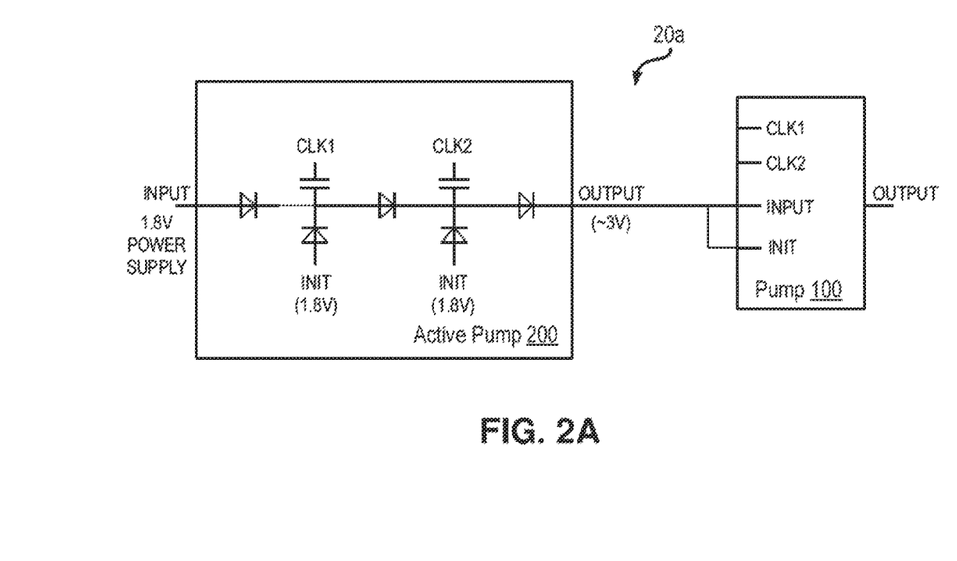
FIGS. 2A and 2B are block diagrams illustrating fast charge-pump circuits with an active charge pump, according to example embodiments.

FIG. 2A is block diagram illustrating an example embodiment of a fast charge-pump circuit 20a, which is configured according to the techniques described herein to include an active charge pump 200 coupled as input to charge pump 100. The input of active pump 200 is coupled to a 1.8V power supply. The control/clock and init terminals of active pump 200 are coupled to clock and initializations signals (not shown) respectively, and the voltage applied by these signals may be an appropriate voltage (e.g., such as 1.8V). The output of active pump 200 is coupled to the input and init terminals of charge pump 100. The control/clock terminal(s) of charge pump 100 are coupled to clock signals (not shown) that apply an appropriate voltage (e.g., such as 3V). For example, the output of active pump 200 is approximately 3V, which is applied to the input and init terminals of charge pump 100.

According to the techniques described herein, in operation active pump 200 is configured to generate/maintain an output voltage even when charge pump 100 is idle or off. Active pump 200 is configured to provide an initialization (init) voltage to replenish charge pump 100 when charge pump 100 is not in operation (e.g., is idle or off), and to provide the init voltage and an input voltage to charge pump 100 when charge pump 100 is in operation. In this manner, charge pump 100 starts its boosting and charging phases at a higher voltage (approximately ~3V), thereby improving the ramp time of the output voltage from charge pump 100 (which is also the final output voltage of circuit 20a).

Figure 2B:
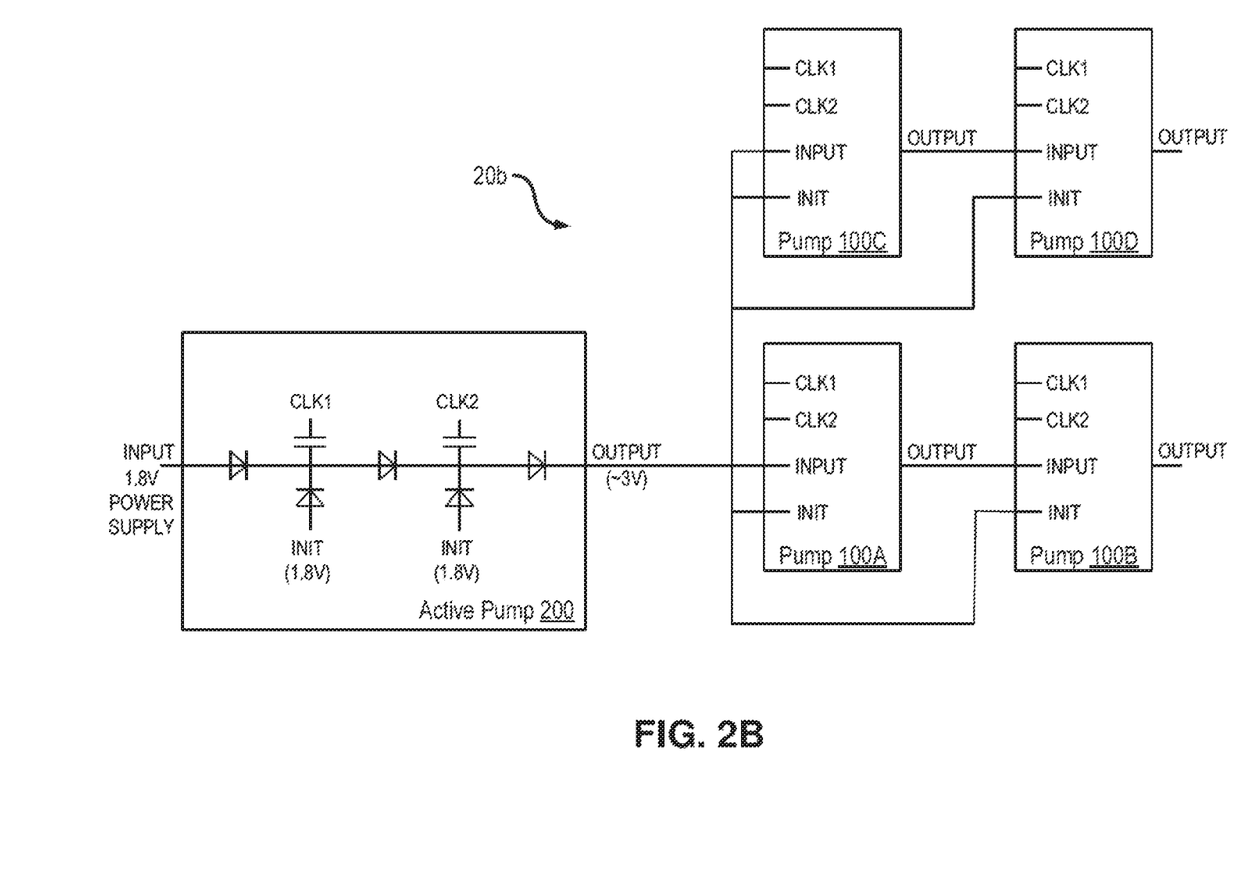

FIG. 2B is block diagram illustrating an example embodiment of a fast charge-pump circuit 20b, which is configured according to the techniques described herein to include an active charge pump 200 coupled to charge pumps 100A, 100B, 100C, and 100D. While the embodiment in FIG. 2B illustrates the active charge pump being coupled to four other charge pumps, it is noted that the techniques described herein are not so limited, and in different charge-pump circuits the active charge pump can be coupled (e.g., in parallel and/or in series) to a different number of charge pumps depending on the particular application. Thus, the configuration of fast charge-pump circuit 20b in FIG. 2B is to be regarded in an illustrative rather than a restrictive sense.

In FIG. 2B, the input of active pump 200 is coupled to a 1.8V power supply. The clock and init terminals of active pump 200 are coupled to clock and initializations signals (not shown) respectively, and the voltage applied by these signals may be an appropriate voltage (e.g., such as 1.8V). The output of active pump 200 is coupled in parallel to the input terminals of charge pumps 100A and 100C and to the init terminals of all four charge pumps 100A, 100B, 100C, and 100D. The output of charge pump 100A is coupled in series to the input terminal of charge pump 100B, and the output of charge pump 100C is coupled in series to the input terminal of charge pump 100D. The clock terminals of each charge pump 100A, 100B, 100C, and 100D are coupled to clock signals (not shown) that apply an appropriate voltage (e.g., such as 3V). In some embodiments, one or more of charge pumps 100A, 100B, 100C, and 100D may itself be configured as an active pump to maintain an output voltage when other pump(s) of circuit 20b are not in operation (e.g., are idle or off).

According to the techniques described herein, in operation active pump 200 of circuit 20b is configured to apply initialization voltage of approximately 3V to each of the next charge pumps 100A, 100B, 100C, and 100D. Active pump 200 is also configured to supply input voltages of approximately 3V to each of charge pumps 100A and 100C when these charge pumps are in operation. While pumping their output voltage to approximately 5V, charge pumps 100A and 100C apply their output voltages at the input terminals of charge pumps 100B and 100D, respectively, for further pumping.

In accordance with the techniques described herein, in operation active pump 200 is configured to generate/maintain an output voltage even when the other charge pumps of circuit 20b are idle or off. Taking one embodiment for a voltage generator in an NVM device as an example, the input supply voltage of a charge-pump circuit (e.g., such as circuit 20b) may be a regular 1.8V applied to an active charge pump (e.g., such as pump 200). However, the input voltage of each succeeding charge pump in the circuit would not be a custom or external power supply, but the output voltage from a preceding charge pump (e.g., 3V). In effect, the regular memory supply voltage of 1.8V is ramped by the charge-pump circuit at the same rate as a 3V charge pump (or at a slightly better rate), but with low standby current leakage and with better die area than a regular 1.8V pump or a custom/external power supply. In this manner, maintaining the active charge pump always on (e.g., to continuously generate an output voltage of approximately 3V) allows the set of other charge pumps to be turned on only in active modes (such as read, write, program, or erase operations) of the NVM device and to start pumping with approximately ~3V supply/input and initialization voltages (rather than the regular 1.8V), thereby allowing the set of other charge pumps to ramp up more quickly.

Figure 3:
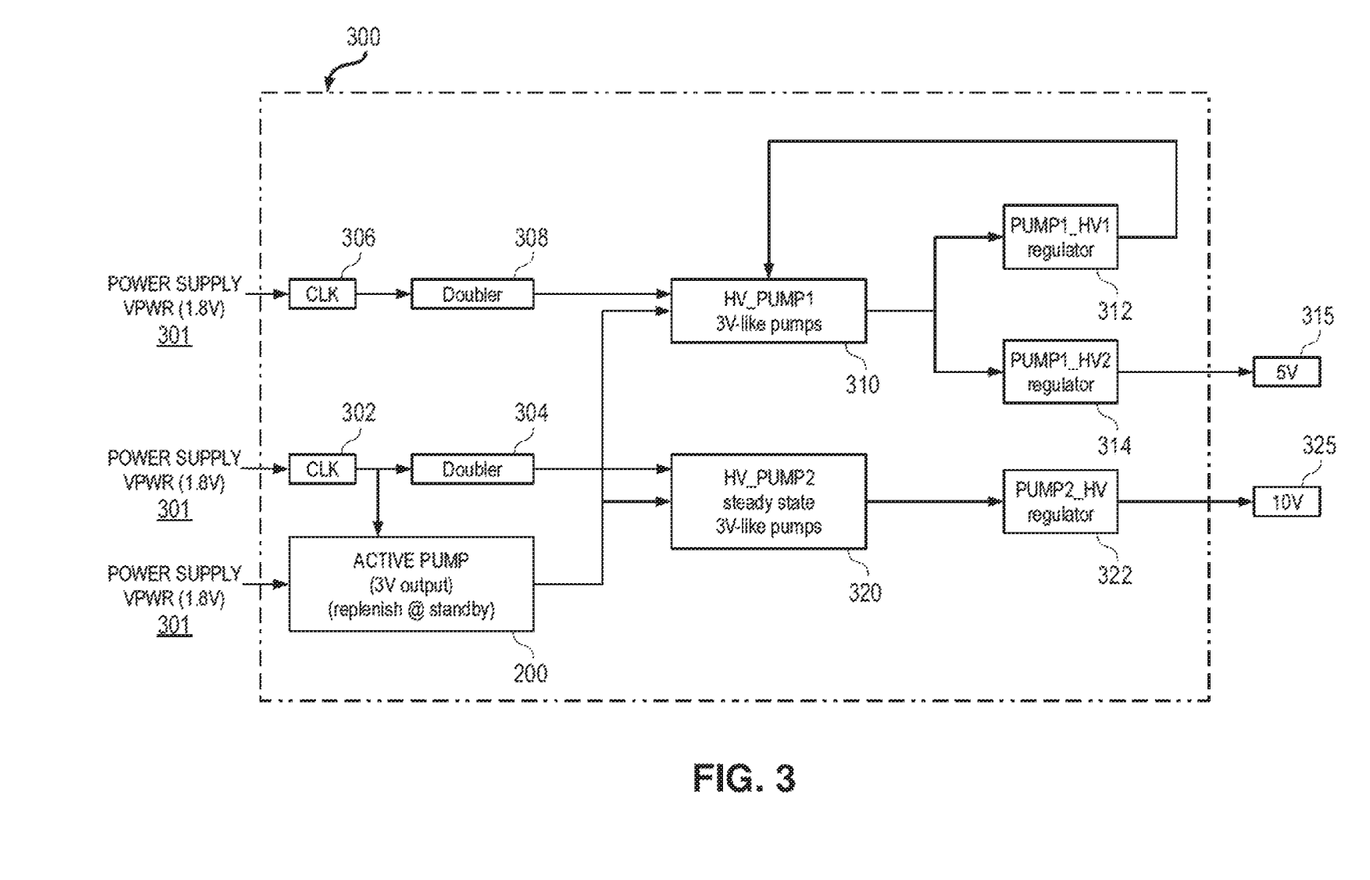
FIG. 3 is a block diagram illustrating a fast charge-pump circuit for a non-volatile memory (NVM) device, according to an example embodiment.

FIG. 3 is a block diagram illustrating fast charge-pump circuit 300 for a non-volatile memory (NVM) device, according to an example embodiment. Circuit 300 is coupled to power supply 301 that provides a power supply voltage (e.g., Vcc) thereto. In the embodiment of FIG. 3 the power supply voltage Vcc is around 1.8V (e.g., ±10%), but other embodiments may use a different standard voltage. Power supply 301 is used by circuit 300 to generate voltage signals that are provided to various charge pumps in accordance with the techniques described herein. In some embodiments, power supply 301 may be external to the NVM device and/or may be configured to receive control signals from the NVM device itself or from a processing device thereof.

Power supply 301 is coupled to provide an input voltage to clock circuits 302, 306 and to active charge pump 200. Clock circuits 302 and 306 include various transistors, logic gates, and other hardware timer circuitry configured to generate clock signals. Clock circuit 302 is coupled to voltage doubler 304 and to active pump 200, and is configured to generate and provide clock signals thereto. Clock circuit 306 is coupled to voltage doubler 308 and configured to generate and provide clock signals thereto. Voltage doublers 304 and 308 include logic gates, gate drivers, and other hardware circuitry configured to double the voltages of the input clock signals received from clock circuits 302 and 306, respectively, to approximately ~3V. Doubler 304 is coupled HV_PUMP2 pump 320 and is configured to provide clock signals with the doubled voltage thereto. Doubler 308 is coupled HV_PUMP1 pump 310 and is configured to provide clock signals with the doubled voltage thereto.

Pump 310 is configured to include 3V-like charge pumps (e.g., such as charge pump 100 in FIG. 1). Pump 310 is coupled as input to PUMP1_HV1 regulator 312 and to PUMP1_HV2 regulator 314. Regulator 312 is a high voltage regulator that is coupled in a feedback loop to provide a feedback voltage signal to pump 310. Regulator 314 is a high voltage regulator that is configured to provide an output voltage signal to output 315. Within the NVM device, output 315 may be coupled to circuitry connected to the bit lines of a memory array to provide a regulated voltage (e.g. 5V) for memory operations performed on the memory array.

Pump 320 is configured to include 3V-like charge pumps (e.g., such as charge pump 100 in FIG. 1). Pump 320 is coupled as input to PUMP2_HV regulator 322. Regulator 322 is a high voltage regulator that is configured to provide an output voltage signal to output 325. Within the NVM device, output 325 may be coupled to circuitry connected to the word lines of a memory array to provide a regulated voltage (e.g. 10V) for memory operations performed on the memory array.

In a fast charge-pump circuit according to the techniques described herein, active pump 200 is coupled to power supply 301 and is configured to receive its input and init signals of approximately 1.8V. Active pump 200 is also coupled to the output of clock circuit 302 and is configured to receive its clock signals that are also at an approximately 1.8V voltage. Active pump 200 is configured to get continuously replenished from power supply 301 to generate and maintain an output voltage of 3V. The power output of active pump 200 (e.g., standby current and output voltage) is coupled to the input and init terminals of both pump 310 and pump 320. In operation, active pump 200 generates and feeds input/supply and initialization voltages to the next stage charge pumps 310 and 320, which then generate the final output voltages at outputs 315 and 325, respectively.

For example, in operation the output voltage of active pump 200 is applied during the initialization phase of the 3V-like charge pumps of pump 310 (e.g., when pump 310 is idle). The output voltage of active pump 200 is also applied during the operation (e.g., boosting and charging phases) of the 3V-like charge pumps of pump 310. This allows pump 310 to ramp up faster when it is turned on in active modes (such as read, program, or erase operations) of the NVM device (not shown) to generate the desired 5V voltage at output 315.

Similarly, in operation the output voltage of active pump 200 is applied during the initialization phase of the 3V-like charge pumps of pump 320 (e.g., when pump 320 is idle). The output voltage of active pump 200 is also applied during the operation (e.g., boosting and charging phases) of the 3V-like charge pumps of pump 320. This allows pump 320 to ramp up faster when it is turned on in active modes (such as read, program, or erase operations) of the NVM device (not shown) to generate the desired 10V voltage at output 325.

Figure 4:
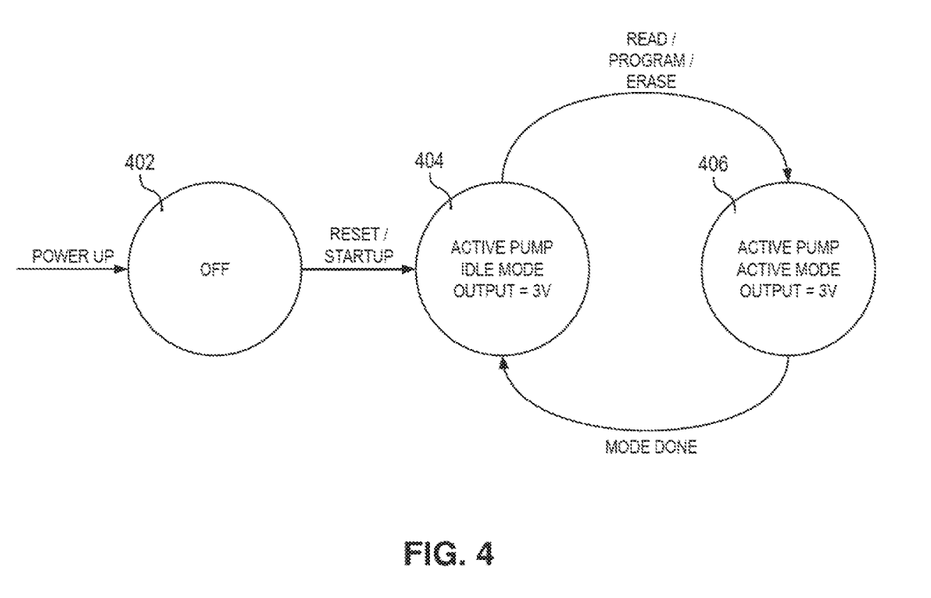
FIG. 4 is a state diagram illustrating operation of an active charge pump, according to an example embodiment.

FIG. 4 is a state diagram illustrating the operation of an active pump in a fast charge-pump circuit during the various modes of an NVM device, in accordance with some embodiments.

Prior to state 402, the NVM device may not be powered and the active charge pump (and any other charge pumps) of the fast charge-pump circuit are off In state 402, the NVM device is powered, but the active pump of the fast charge-pump circuit continues to be in the off state. Thereafter, a reset or a startup signal is applied to the active charge pump. The other charge pumps of the charge-pump circuit are kept in the idle/off state.

In response to the reset/startup signal, in state 404 the active charge pump is started and a supply voltage of 1.8V is applied thereto. The active charge pump is kept on even though the NVM device may be in an idle mode. For example, the active charge pump is turned on to generate and maintain an output voltage of 3V even though the NVM device is not performing any read, program, or erase operations. The other charge pumps of the charge-pump circuit are still kept in the idle/off state, in which they may receive only an initialization voltage of 3V from the active charge pump for the initialization phases of their respective charge pump stages.

In response to a read, program, and/or erase operation signal provided in/to the NVM device, in state 406 the NVM device transitions to an active mode to perform a read, program, and/or erase operation on its flash memory array. In this active mode, the active charge pump continues to generate its output voltage of 3V. The other charge pumps of the charge-pump circuit are also turned on (e.g., by appropriate clock and/or control signals) and start receiving their respective pump clocks. The charge pumps boost their respective input voltages to the level needed for the read, program, and/or erase operations.

When the read, program, and/or erase operations are completed, the NVM device transitions back to its idle mode. In response the active charge pump transitions back to state 404, in which it is kept on to maintain its standby output voltage of 3V, while the other charge pumps of the charge-pump circuit are placed in the idle/off state (e.g., by appropriate clock/control signals).

In this manner, the techniques described herein provide for operating the active charge pump of the charge-pump circuit to continuously generate an output voltage, while the other charge pumps are turned on-demand only during the active modes of the NVM device. This ensures a low standby current of the active charge pump and a fast ramp time of the other charge pumps (and of the whole circuit, as a result) at the expense of the low supply voltage applied to the "always-on" active charge pump.

Figure 5:
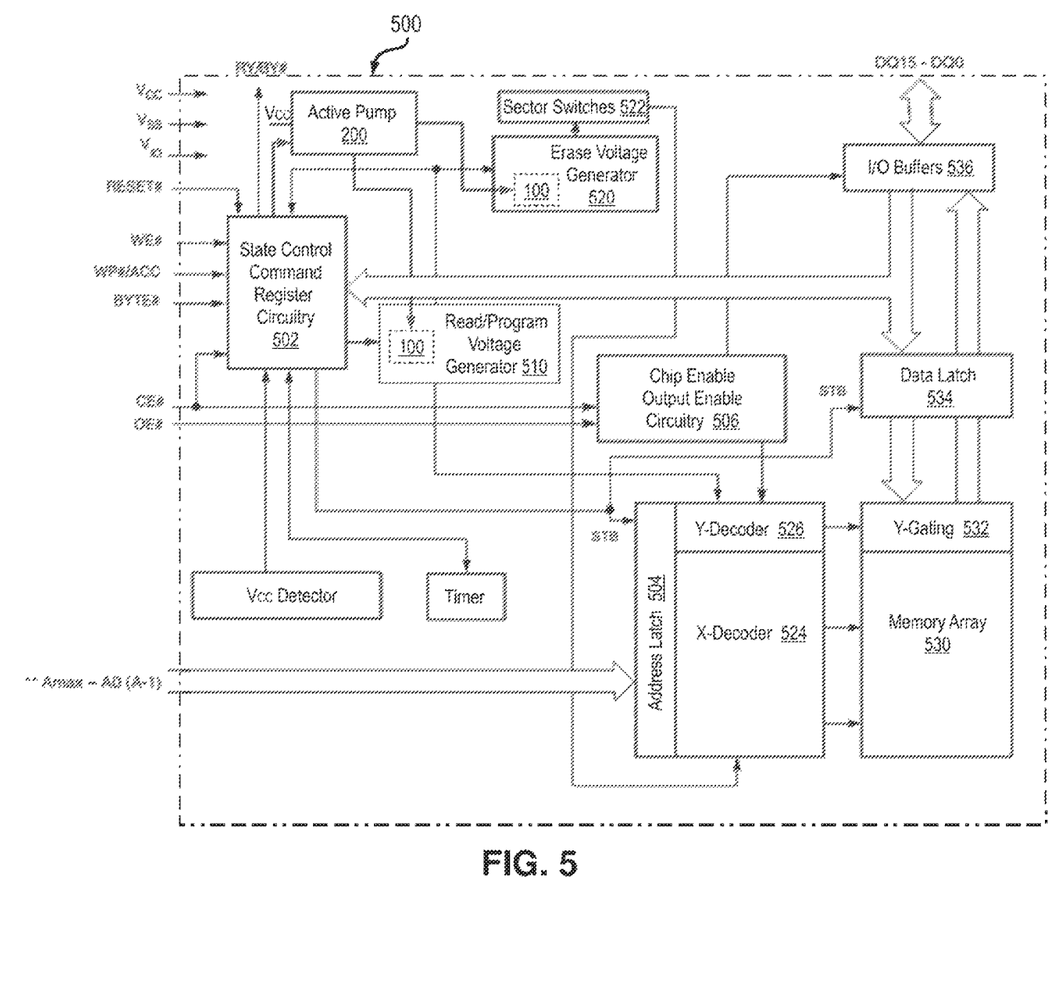
FIG. 5 is a block diagram illustrating a portion of an example NVM system according to some embodiments.

FIG. 5 is a block diagram illustrating a portion of an example NVM system 500 according to some embodiments of the techniques described herein. Computing devices (e.g., such as laptop/notebook computers, tablets, smartphones, and the like) may store data, configuration information, and/or programs in a NVM system (e.g., such as a NAND and NOR flash memory, EEPROM, and F-RAM). In some embodiments, NVM system 500 may be implemented as an embedded on-chip subsystem (e.g., a flash macro that includes additional components such as SRAM, a microprocessor, and other hardware components) within a microcontroller unit (MCU) disposed on a semiconductor substrate, such as the substrate of an integrated circuit (IC) device. In some embodiments, the components of NVM system 500 may reside on a common carrier substrate such as, for example, an IC die substrate, a multi-chip module substrate, or the like. Alternatively, in some embodiments the components of NVM system 500 may be one or more separate integrated circuits with discrete components. In some embodiments NVM system 500 may be configured within a system-on-chip (SoC) device, while in various other embodiments NVM system 500 may be configured in various other types of devices—e.g., such as a microprocessor, a central processing unit (CPU), a controller, a special-purpose processor, a digital signal processor (DSP), an application specific integrated circuit (ASIC), a field programmable gate array (FPGA), and the like. It should be appreciated that in FIG. 5 NVM system 500 has been simplified for the purpose of illustration, and is therefore not intended to be a complete description. In particular, details of the various hardware components illustrated in FIG. 5 are not described in detail herein. It should also be appreciated that in various embodiments NVM system 500 may include some, all, or different/additional components than the embodiment in FIG. 5. Thus, NVM system 500 in FIG. 5 should be regarded in an illustrative rather than a restrictive sense.

In the embodiment of FIG. 5, NVM system 500 may include a processing device (not shown) that is coupled thereto via one or more buses such as an address bus (e.g., lines Amax-A0), a data bus (e.g., lines DQ15-DQ0), and a control bus (e.g., various lines such as RESET#, WE#, WP#/ACC, etc.) that may operate according to a Serial Peripheral Interface (SPI) communication protocol. A power supply (not shown) is coupled to NVM device 500 over one or more lines (e.g., Vcc, Vss, Vio) to provide various power supply voltages thereto. For example, in the embodiment of FIG. 5 the power supply voltage Vcc may be around 1.8V (e.g., ±10%). In various embodiments, the power supply may be external and/or internal to NVM device 500, and is used by NVM device 500 to generate voltage signals that are used by various components of the NVM device. In the embodiment of FIG. 5, the power supply may be configured to receive control signals and/or configuration data from control circuitry 502 of NVM device 500.

Control circuitry 502 is configured with various hardware components (e.g., transistors, logic gates, and various other analog and/or digital circuits) to provide state and command register control for NVM device 500. Control circuitry 502 is coupled to receive signals from various control lines and busses (e.g., RESET#, WP#/ACC, BYTE#, CE#, DQ15-D0, etc.), to send control and command signals (e.g., to active pump 200, voltage generators 510 and 520, latches 504 and 534, etc.), and to control signals applied to memory array 530 during various memory operations. Control circuitry 502 may also be coupled to receive signals from various timers used for timing and power-up operations and from various detectors (e.g., such as a Vcc detector configured to detect when the power supply voltage, Vcc, is high enough so that system 500 can be turned on).

NVM system 500 includes an address latch 504 that is coupled to the address bus (e.g., lines Amax-A0) to receive the addresses for various memory operations performed on memory array 530. Address latch 504 is also coupled to receive control signals from control circuitry 502 and is configured to latch an address state, previously received on the address bus, for a subsequent operation. In NVM system 500, address latch 504 is coupled to the X-decoder (or row decoder) 524 and Y-decoder (or column decoder) 526.

NVM system 500 also includes chip/output enable circuitry 506 and data latch 534. Enable circuitry 506 is configured to receive enable signals from a control bus (e.g., lines CE#, OE#, etc.) and to provide signals to control the data paths between the data bus (e.g., lines DQ15-DQ0) and the memory array 530. Data latch 534 is coupled to the data bus to receive and send the data for various memory operations performed on memory array 530. Date latch 534 is coupled to receive control signals from control circuitry 502 and is configured to latch the input and output data received on the data bus for the various memory operations. Data latch 534 is coupled to receive and send data signals between I/O buffers 536 and Y-gating circuitry 532. I/O buffers 536 include circuitry configured to temporarily store data signals that pass between the data bus and memory array 530 and to match the difference in rates at which they handle the data signal processing. In NVM system 500, Y-gating circuitry 532 is coupled to memory array 530 and may include sense amplifiers configured to read multi-bit words from the memory cells in the memory array.

Memory array 530 is a flash memory array (e.g., such as a 64 MBit flash array). Memory array 530 is coupled to X-decoder 524 (e.g., either directly or through one or more select and/or word lines) and to Y-decoder 526 via multiple bit lines. Memory array 530 is a group of flash memory cells organized into rows and columns, such that each memory cell can be accessed randomly by row and column address through the row and column decoder circuits. A flash memory cell could include just a memory transistor, or could include select gate(s), memory gate(s), and one or more memory transistors disposed over a channel formed in an IC substrate between a source and a drain. Each memory cell in memory array 530 may store one or more bits of information in its memory transistor(s) that can be accessed in read, program, and erase operations. In the embodiment of FIG. 5, the memory cells in memory array 530 are organized in sectors. Each sector may include a number of rows and columns of memory cells (e.g., 4096 columns and 256 rows per sector).

In a read memory operation, a bit stored in memory array 530 is read from an address specified in the read operation. The address information is passed through the address latch 504 and is decoded by X-decoder 524 and Y-decoder 526 to determine the corresponding memory cell. As an example for current-based sensing, to read a bit stored at the decoded address, a voltage is applied to the memory gate of the corresponding memory cell. The voltage is precisely generated (e.g., by voltage generator 510) so that it lies substantially equidistant between the target voltage necessary to turn on the memory transistor when storing a "high" bit and the target voltage necessary to turn on the transistor when storing a "low" bit, in order to clearly distinguish between two states. If the application of the voltage during the read operation causes a sense amplifier of Y-gating circuitry 532 to detect a flow of substantial current between the source and the drain of the memory cell which is equivalent to the target current range, then the memory cell holds a "high" bit. Alternatively, if the application of the voltage during the read operation does not cause the sense amplifier of Y-gating circuitry 532 to detect a flow of substantial current between the source and the drain of the memory cell equivalent to the target current range, then the memory cell holds a "low" bit.

In an erase memory operation, the bits stored in the memory cells of a given sector of memory array 530 are erased based on address information specified in the erase operation. The address information is passed through address latch 504 to X-decoder 524 and Y-decoder 526, and sector select signals are passed to the X-decoder 524 from sector switches 522 to indicate the sector that is to be erased. In order to "erase" any charge that may be stored within the memory transistor of a memory cell and return its state to a "high" bit, a precise voltage (e.g., generated by voltage generator 520) is applied to the source of the memory cell. The drain of the memory cell is floated (or held at a certain bias), a precisely generated high negative voltage (e.g., by voltage generator 520) is applied to its memory gate, and its select gate is grounded. The bias conditions between the memory gate and the source of the memory cell effectively erases the memory transistor to the "high" bit state.

In a program memory operation, a bit stored in memory array 530 is written to an address specified in the program operation. The address information is passed through the address latch 504 and is decoded by X-decoder 524 and Y-decoder 526 to determine the corresponding memory cell. In a program operation on a memory cell in memory array 530, a positive voltage is applied to the select gate of the memory cell, while a higher positive voltage (e.g., generated by voltage generator 510) is applied to its memory gate. The bias conditions between the memory gate and the source of the memory cell effectively programs a "low" bit within the memory transistor of the memory cell, which continues to be stored even after the various voltages are removed.

In accordance with the techniques described herein, NVM system 500 includes active pump 200, read/program voltage generator 510, and erase voltage generator 520. Active pump 200 is coupled to receive power supply voltage Vcc and is configured to receive therefrom input and init signals of approximately 1.8V. Active pump 200 is also coupled to control circuitry 502 to receive therefrom clock and control signals (e.g., also at approximately 1.8V). The output of active pump 200 is coupled to the input and init terminals of charge pumps 100 in both voltage generators 510 and 520. Active pump 200 is configured to get continuously replenished by the power supply voltage Vcc to generate and maintain an output voltage of 3V even when generators 510 and 520 are not in operation (e.g., are idle). During an idle mode of NVM system 500 (e.g., when no memory operations are being performed), active pump 200 generates and feeds an init voltage of approximately 3V to the charge pumps 100 in voltage generators 510 and 520. During an active mode of NVM system 500 (e.g., during read, program, or erase memory operations), active pump 200 generates and feeds an init voltage and an input voltage (both of approximately 3V) to the charge pumps 100 in voltage generators 510 and 520, which then generate the final output voltages that are needed for the memory operations.

Read/program voltage generator 510 is a voltage regulation circuit configured to generate precise voltages which are applied to the memory cells of memory array 530 during read and program memory operations. Voltage generator 510 is coupled to receive input and init voltages from active pump 200 and clock signals from control circuitry 502, and its output is coupled to Y-decoder 526. According to the techniques described herein, the charge pumps 100 in voltage generator 510 are turned on on-demand during read and program operations, and the voltage generator generates high voltage signals that are provided to Y-decoder 526 and to the bit lines of the selected memory cells of memory array 530.

Erase voltage generator 520 is a voltage regulation circuit configured to generate precise voltages which are applied to the memory cells of memory array 530 during erase memory operations. Voltage generator 520 is coupled to receive input and init voltages from active pump 200 and clock signals from control circuitry 502, and its output is coupled to X-decoder 524 though sector switches 522. According to the techniques described herein, the charge pumps 100 in voltage generator 520 are turned on on-demand during erase operations, and the voltage generator generates high voltage signals that are provided through sector switches 522 to X-decoder 524 and to the word lines of the selected memory cells of memory array 530.

In a fast charge-pump circuit according to the techniques described herein, the output voltage of active pump 200 is applied as init voltage during the initialization phase of charge pumps 100 in voltage regulators 510 and 520 (e.g., when the charge pumps 100 are idle). The output voltage of active pump 200 is also applied as input and init voltages during the operation (e.g., boosting and charging phases) of charge pumps 100 in voltage regulators 510 and 520. This allows voltage regulators 510 and 520 to ramp up faster when turned on in active modes (such as read, program, or erase memory operations) of NVM system 500 to generate the voltages needed to perform the memory operations.

Figure 6:
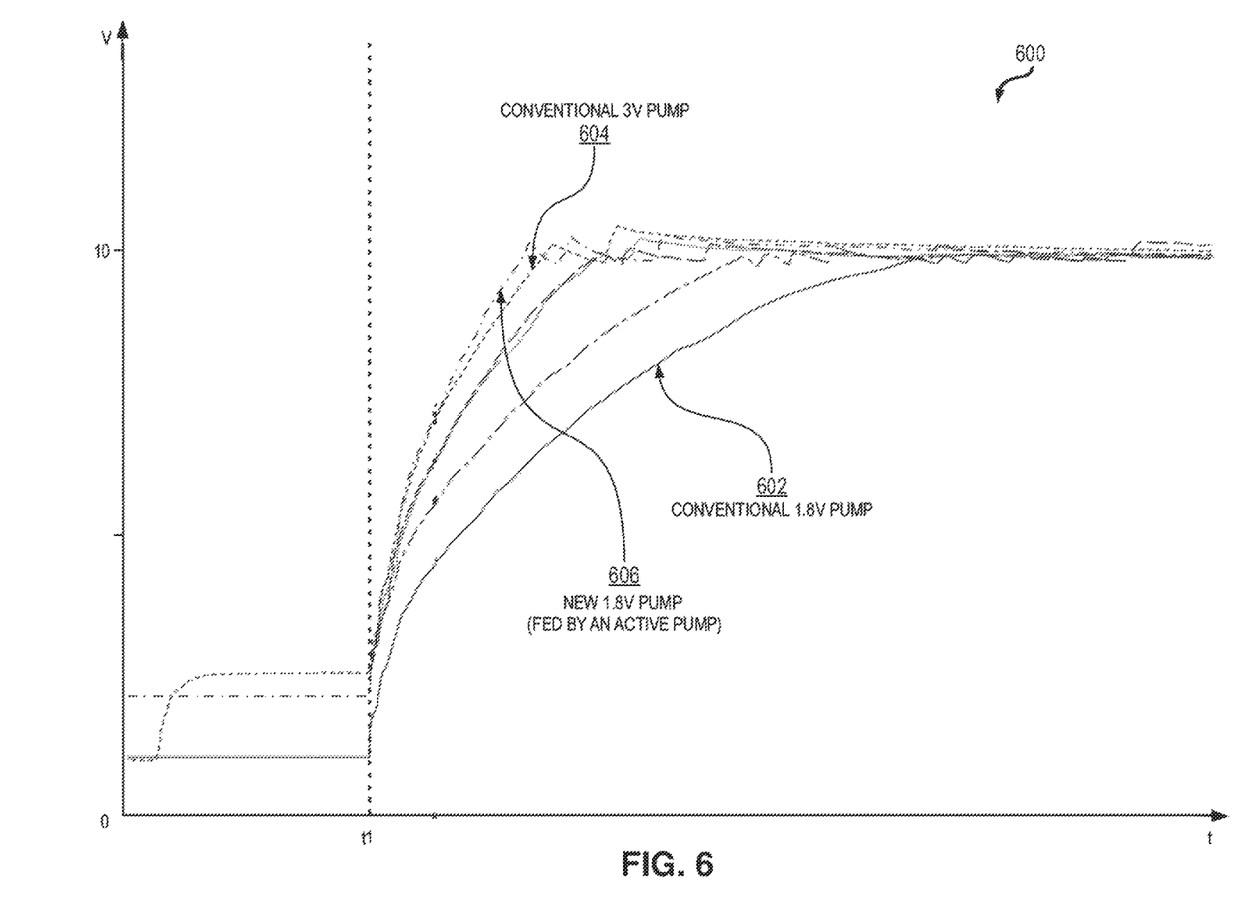
FIG. 6 illustrates a comparative diagram with ramp-up voltage waveforms for various charge pumps.

FIG. 6 illustrates a comparative diagram with ramp-up voltage waveforms for various charge pumps. Diagram 600 shows how the voltage ramp-up 602 of a conventional 1.8V charge pump and the voltage ramp-up 604 of a conventional 3V charge pump compare to the voltage ramp-up 606 of a charge pump in a fast charge-pump circuit according to the techniques described herein. As indicated by ref. 606, the active pump in the fast charge-pump circuit ramps up the succeeding charge pump a lot faster than a conventional 1.8V charge pump (supplied by a regular 1.8V voltage) and at rate that can be equivalent to a conventional 3V pump (supplied by a custom/higher voltage).

The fast charge-pump circuits according to the techniques described herein include an active charge pump that continuously generates and feeds its output voltage as input and/or initialization voltages to the other charge pumps in the circuit. For example, by maintaining an active charge pump which always generates approximately ~3V output voltage, another set of charge pumps in the circuit can be turned on only in active modes (e.g., during read, program, or erase operations) and will start pumping with a 3V input and initialization voltages rather than a regular 1.8V voltage, thereby allowing these pumps to ramp up more quickly. In this manner, the charge-pump circuits described herein achieve low standby current, fast ramp rate, and smaller chip layout area than previous solutions.

In various embodiments, the charge-pump circuits of the techniques described herein may be used in various semiconductor components and circuit blocks including, without limitation, various high voltage (HV) architecture circuits (e.g., such as voltage regulators, voltage doublers, etc.), various power supply circuits (e.g., for flash memory and volatile RAM), various digital-to-analog converters (DACs), and various other components that may require power at higher voltages periodically and/or on-demand (e.g., such as non-inductive voltage multipliers).

Various embodiments of the techniques described herein may include performance of various operations. These operations may be performed by hardware components, firmware, or a combination thereof. As used herein, the terms "coupled to" and "coupled with" mean connected directly or connected indirectly through one or more intervening components that may include various buses or lines. Any of the signals provided over various buses and/or lines described herein may be time multiplexed with other signals and provided over one or more common buses and/or lines. Additionally, the interconnection between circuit components or blocks may be shown as buses or as single signal lines. Each of the buses may alternatively be one or more single signal lines and each of the single signal lines may alternatively be buses.

Certain embodiments may be implemented by using, or under the control of, executable firmware instructions stored on a non-transitory computer-readable medium, e.g., such as volatile storage and/or non-volatile storage. Such instructions may be used to program and control one or more semiconductor devices that include one or more general-purpose or special-purpose processors (e.g., such as CPUs) or equivalents thereof (e.g., such as processing cores, processing engines, microcontrollers, and the like), so that when executed by the processor(s) or the equivalents thereof, the instructions cause the device(s) to perform various operations. The non-transitory computer-readable storage medium may include, but is not limited to, read-only memory (ROM), random-access memory (RAM), static RAM (SRAM), dynamic RAM (DRAM), erase-able programmable memory (e.g., EPROM and EEPROM), flash memory, or another now-known or later-developed type of medium that is suitable for storing executable instructions and data therefor.

Although the operations of any method(s) herein may be shown and described in a particular order, the order of the operations of each method may be altered so that certain operations may be performed in an inverse order so that certain operation may be performed, at least in part, concurrently with other operations. In other embodiments, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A charge-pump circuit comprising:
   multiple charge pumps including a first charge pump and a second charge pump, wherein the first charge pump is coupled as input to the second charge pump;
   an active charge pump coupled as input to the first charge pump; and
   a power supply coupled as input to the active charge pump;
   wherein the active charge pump is configured to initialize the first charge pump to a first voltage that has a greater absolute value than the power supply and to provide to the first charge pump an input voltage during operation of the first charge pump;
   wherein the first charge pump is configured to initialize the second charge pump to a second voltage that is greater than the first voltage;
   wherein the active charge pump is configured to continuously generate an output voltage even when one or more of the multiple charge pumps are idle or off.

2. The circuit of claim 1, wherein the multiple charge pumps include one or more charge pumps coupled to the active charge pump in parallel with the first charge pump.

3. The circuit of claim 1, wherein the multiple charge pumps include one or more charge pumps coupled in series to the output of the first charge pump.

4. The circuit of claim 1, wherein the first charge pump is another active charge pump of the charge-pump circuit.

5. The circuit of claim 4, wherein the multiple charge pumps include two or more charge pumps coupled in parallel to the output of the other active charge pump.

6. The circuit of claim 4, wherein the multiple charge pumps include one or more charge pumps coupled in series to the output of the other active charge pump.

7. A memory device comprising:
   a memory array; and
   a charge-pump circuit, wherein the charge-pump circuit comprises:
     a first charge pump;
     a second charge pump, wherein the first charge pump is coupled as input to the second charge pump;
     an active charge pump coupled as input to the first charge pump; and
     a power supply coupled as input to the active charge pump;
     wherein the active charge pump is configured to initialize the first charge pump to a first voltage that has a greater absolute value than the power supply and to provide an input voltage to the first charge pump during an active mode of the memory array;
     wherein the first charge pump is configured to initialize the second charge pump to a second voltage that is greater than the first voltage;
     wherein the active charge pump is configured to continuously generate an output voltage even when the first charge pump is idle or off.

8. The memory device of claim 7, wherein the charge-pump circuit comprises a third charge pump that is coupled to the active charge pump in parallel with the first charge pump.

9. The memory device of claim 7, wherein the first charge pump is another active charge pump of the charge-pump circuit.

10. The memory device of claim 7, wherein the first charge pump is configured to operate in the active mode during a read operation on the memory array.

11. The memory device of claim 7, wherein the first charge pump is configured to operate in the active mode during a program operation on the memory array.

12. The memory device of claim 7, wherein the first charge pump is configured to operate in the active mode during an erase operation on the memory array.

13. The memory device of claim 7, wherein the first charge pump is configured to operate in the active mode during a write operation on the memory array.

14. The memory device of claim 7, wherein the memory device is a volatile memory device.

15. The memory device of claim 7, wherein the memory array and the charge-pump circuit are disposed on the same semiconductor substrate.

16. A method of operating a charge-pump circuit, the method comprising:
   applying a power supply voltage to an active charge pump of the charge-pump circuit, wherein the active charge pump is coupled as input to multiple charge pumps of the charge-pump circuit, and wherein the active charge pump is configured to continuously generate an output voltage even when one or more of the multiple charge pumps are idle or off;
   initializing, by the active charge pump, a first charge pump of the multiple charge pumps to a first voltage that has a greater absolute value than the power supply voltage, wherein the first charge pump is coupled as input to a second charge pump of the multiple charge pumps;
   applying by the first charge pump to the second charge pump a second voltage that is greater than the first voltage; and
   providing an input voltage by the active charge pump to the first charge pump during operation of the first charge pump.

17. The method of claim 16, further comprising initializing by the active charge pump a third charge pump, of the multiple charge pumps, to the first voltage.

18. The method of claim 16, wherein the first charge pump is another active charge pump of the charge-pump circuit.

* * * * *